(12) United States Patent
Song et al.

(10) Patent No.: US 10,720,323 B2
(45) Date of Patent: Jul. 21, 2020

(54) METHOD FOR PROCESSING A SEMICONDUCTOR WAFER USING A THIN EDGE CARRIER RING

(71) Applicant: Texas Instruments Incorporated, Dallas, TX (US)

(72) Inventors: Jian Song, Plano, TX (US); Ruben Anthony Pesina, Murphy, TX (US); Kamal Avala, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/990,999

(22) Filed: Jan. 8, 2016

(65) Prior Publication Data
US 2016/0126090 A1 May 5, 2016

Related U.S. Application Data

(63) Continuation of application No. 13/153,939, filed on Jun. 6, 2011, now abandoned.
(Continued)

(51) Int. Cl.
| | | |
|---|---|---|
| *H01L 21/02* | (2006.01) | |
| *C23C 16/455* | (2006.01) | |
| *H01J 37/32* | (2006.01) | |
| *C23C 16/509* | (2006.01) | |
| *C23C 16/458* | (2006.01) | |
| *B08B 7/00* | (2006.01) | |

(Continued)

(52) U.S. Cl.
CPC ...... *H01L 21/02274* (2013.01); *B08B 7/0035* (2013.01); *B08B 9/08* (2013.01); *C23C 16/4585* (2013.01); *C23C 16/45565* (2013.01); *C23C 16/509* (2013.01); *H01J 37/32623* (2013.01); *H01L 21/02126* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 4,341,592 A | * | 7/1982 | Shortes | H01L 21/31138 134/2 |
| 4,793,975 A | | 12/1988 | Drage | |

(Continued)

FOREIGN PATENT DOCUMENTS

| | | | | |
|---|---|---|---|---|
| WO | WO 2007131547 A1 | | 11/2007 | |
| WO | WO-2009024533 A1 | * | 2/2009 | ......... C23C 16/4408 |
| WO | WO-2011105010 A1 | * | 9/2011 | ......... C23C 16/4585 |

OTHER PUBLICATIONS

Virginia Semiconductor, "Your Guide to SEMI Specifications for Si Wafers," pp. Jun. 3, 2002, available Mar. 18, 2014 online at https://www.virginiasemi.com/?cont_uid=27. (Year: 2002).*

(Continued)

*Primary Examiner* — Jeffrie R Lund
*Assistant Examiner* — Stanislav Antolin
(74) *Attorney, Agent, or Firm* — Rose Alyssa Keagy; Charles A. Brill; Frank D. Cimino

(57) ABSTRACT

A method for processing a semiconductor wafer in a PECVD deposition chamber with a circular pedestal and a recessed portion formed around the outer top surface of the pedestal. The method may include using a circular wafer carrier ring with a recessed portion.

22 Claims, 4 Drawing Sheets

Related U.S. Application Data

(60) Provisional application No. 61/351,378, filed on Jun. 4, 2010.

(51) Int. Cl.
*B08B 9/08* (2006.01)
*H01L 21/677* (2006.01)

(56) References Cited

U.S. PATENT DOCUMENTS

| | | | |
|---|---|---|---|
| 4,808,554 A | 2/1989 | Yamazaki | |
| 5,302,209 A | 4/1994 | Maeda et al. | |
| 5,372,648 A | 12/1994 | Yamamoto et al. | |
| 5,507,874 A * | 4/1996 | Su | B08B 7/0035 118/723 R |
| 5,647,953 A * | 7/1997 | Williams | B08B 7/0035 134/1.1 |
| 5,656,334 A * | 8/1997 | Doi | B05D 1/62 427/314 |
| 5,780,313 A | 7/1998 | Yamazaki | |
| 5,810,937 A * | 9/1998 | Gupta | B08B 7/0035 134/1.1 |
| 5,976,259 A | 11/1999 | Yamazaki | |
| 6,013,984 A * | 1/2000 | Ellinger | C23C 16/4401 315/111.21 |
| 6,067,999 A * | 5/2000 | Hines | C23C 16/4405 134/1 |
| 6,090,718 A * | 7/2000 | Soga | H01L 21/67069 134/1.1 |
| 6,113,701 A | 9/2000 | Yamazaki | |
| 6,163,648 A | 12/2000 | Moto et al. | |
| 6,167,194 A | 12/2000 | Moto et al. | |
| 6,204,197 B1 | 3/2001 | Yamazaki | |
| 6,264,467 B1 * | 7/2001 | Lue | C23C 16/4581 211/41.18 |
| 6,322,714 B1 * | 11/2001 | Nallan | H01L 21/02071 134/1.2 |
| 6,375,746 B1 | 4/2002 | Stevens et al. | |
| 6,431,807 B1 | 8/2002 | Stevens et al. | |
| 6,527,968 B1 * | 3/2003 | Wang | H01J 37/321 134/1.1 |
| 6,682,603 B2 | 1/2004 | Gondhalekar et al. | |
| 6,699,399 B1 * | 3/2004 | Qian | H01L 21/02071 134/1.1 |
| 6,709,267 B1 | 3/2004 | Hawkins et al. | |
| 6,712,907 B1 | 3/2004 | Pratt et al. | |
| 6,787,054 B2 * | 9/2004 | Wang | H01J 37/321 216/63 |
| 6,797,188 B1 * | 9/2004 | Shen | H01L 21/02071 134/1.1 |
| 6,844,612 B1 | 1/2005 | Yokoyama et al. | |
| 6,852,242 B2 * | 2/2005 | Sun | H01J 37/321 216/60 |
| 6,860,965 B1 | 3/2005 | Stevens | |
| 6,872,322 B1 * | 3/2005 | Chow | H01J 37/32862 134/1.1 |
| 7,014,887 B1 * | 3/2006 | Cohen | B08B 7/0035 134/1.1 |
| 7,214,630 B1 | 5/2007 | Varadarajan et al. | |
| 7,341,761 B1 | 3/2008 | Wu et al. | |
| 7,737,525 B1 | 6/2010 | Wu et al. | |
| 7,960,297 B1 | 6/2011 | Rivkin et al. | |
| 8,262,800 B1 * | 9/2012 | Wongsenakhum | C23C 16/4405 134/1.1 |
| 8,273,670 B1 | 9/2012 | Rivkin et al. | |
| 8,398,816 B1 * | 3/2013 | Gytri | H01L 21/67017 118/723 VE |
| 8,591,659 B1 * | 11/2013 | Fang | H01J 37/32357 134/1.1 |
| 2002/0036065 A1 | 3/2002 | Yamagishi et al. | |
| 2003/0036209 A1 * | 2/2003 | Gilbert | H01L 21/31122 438/3 |
| 2003/0147075 A1 * | 8/2003 | Otsuki | C23C 16/4405 356/338 |
| 2003/0211757 A1 * | 11/2003 | Gondhalekar | C23C 16/45563 438/788 |
| 2003/0232504 A1 * | 12/2003 | Eppler | H01L 21/0276 438/709 |
| 2004/0083976 A1 | 5/2004 | Meyyappan | |
| 2004/0118519 A1 * | 6/2004 | Sen | C23C 16/4405 156/345.33 |
| 2004/0126493 A1 | 7/2004 | Shimizu et al. | |
| 2004/0173156 A1 | 9/2004 | Stimson et al. | |
| 2004/0173319 A1 * | 9/2004 | Suzuki | H01J 37/32623 156/345.51 |
| 2004/0261815 A1 * | 12/2004 | Pavone | B08B 7/0035 134/1.3 |
| 2005/0005859 A1 * | 1/2005 | Koshiishi | H01J 37/32642 118/728 |
| 2005/0078953 A1 * | 4/2005 | Fodor | C23C 16/4585 392/418 |
| 2005/0092439 A1 | 5/2005 | Keeton et al. | |
| 2005/0154482 A1 * | 7/2005 | Tomoyasu | H01J 37/32091 700/108 |
| 2005/0156285 A1 | 7/2005 | Gates et al. | |
| 2005/0193952 A1 * | 9/2005 | Goodman | H01J 37/32871 118/728 |
| 2005/0229849 A1 * | 10/2005 | Silvetti | C23C 16/4404 118/715 |
| 2005/0274396 A1 * | 12/2005 | Shih | C23C 16/4407 134/29 |
| 2006/0043067 A1 * | 3/2006 | Kadkhodayan | C04B 35/505 216/67 |
| 2006/0065631 A1 * | 3/2006 | Cheng | H01J 37/32082 216/86 |
| 2006/0102288 A1 * | 5/2006 | Satoh | H01J 37/32642 156/345.51 |
| 2006/0130758 A1 * | 6/2006 | Lohokare | C23C 16/4404 118/715 |
| 2006/0137988 A1 | 6/2006 | Yahashi et al. | |
| 2006/0151116 A1 * | 7/2006 | Wu | C23F 4/00 156/345.46 |
| 2006/0201533 A1 * | 9/2006 | Wani | C23C 16/4405 134/1.1 |
| 2007/0051471 A1 * | 3/2007 | Kawaguchi | H01J 37/321 156/345.36 |
| 2007/0051472 A1 * | 3/2007 | Murakami | H01J 37/32642 156/345.51 |
| 2007/0204796 A1 | 9/2007 | Hirata et al. | |
| 2007/0228010 A1 * | 10/2007 | Martin | H01L 21/02087 216/83 |
| 2007/0246062 A1 * | 10/2007 | Lai | C23C 16/4405 134/1.1 |
| 2007/0258186 A1 * | 11/2007 | Matyushkin | H01L 21/67109 361/234 |
| 2008/0169065 A1 * | 7/2008 | Takahashi | H01J 37/32477 156/345.35 |
| 2008/0214007 A1 * | 9/2008 | Wang | C23C 16/26 438/694 |
| 2008/0261074 A1 * | 10/2008 | Shishikura | B24C 1/06 428/687 |
| 2008/0289766 A1 | 11/2008 | Heemstra et al. | |
| 2009/0025636 A1 * | 1/2009 | Rasheed | C23C 16/4585 118/500 |
| 2009/0050272 A1 * | 2/2009 | Rosenberg | C23C 14/50 156/345.51 |
| 2009/0068356 A1 * | 3/2009 | Silvetti | C23C 16/4404 427/248.1 |
| 2009/0142167 A1 | 6/2009 | Gate et al. | |
| 2009/0142512 A1 * | 6/2009 | Forster | H01J 37/32477 427/576 |
| 2009/0266299 A1 * | 10/2009 | Rasheed | C23C 16/4581 118/723 R |
| 2010/0029066 A1 | 2/2010 | Miyashita | |
| 2010/0059181 A1 * | 3/2010 | Lee | H01J 37/32623 156/345.51 |
| 2010/0317178 A1 | 12/2010 | Antonelli et al. | |

(56) References Cited

U.S. PATENT DOCUMENTS

| | | | | |
|---|---|---|---|---|
| 2010/0317198 | A1* | 12/2010 | Antonelli | C23C 16/0245 |
| | | | | 438/758 |
| 2011/0017127 | A1* | 1/2011 | von Kanel | C23C 16/4408 |
| | | | | 117/97 |
| 2011/0297088 | A1 | 12/2011 | Song et al. | |
| 2012/0309175 | A1* | 12/2012 | Masumura | C23C 16/4585 |
| | | | | 438/478 |
| 2016/0126090 | A1* | 5/2016 | Song | C23C 16/45565 |
| | | | | 438/780 |

OTHER PUBLICATIONS

Brochure PECVD3000. "Novellus less < is more VECTOR." Novellus Systems, Inc., December 2003, pp. 1-7, Source location: Lam Research Corporation. http://www.lamresearch.com/. Available: http://market360online.com/sqlimages/1182/33825.pdf. Accessed Sep. 26, 2015.

Peter Woytowitz. "Virtual Prototyping of Semiconductor Processing Equipment." Virtual Product Development Conference Oct. 18-20, 2004. Huntington Beach, CA, US. pp. 1-10. Source location: MSC Software Corp. Available: http://web.mscsoftware.com/events/vpd2004/na/proceedings/pdfs/full_papers/2004-011-FP_woytowitz.pdf. Accessed: Jan. 2, 2015.

Vineet Dharmadhikari. "Novellus Delivers 250th VECTOR PECVD System." Interconnect, vol. 7, No. 1, Feb. 2005, p. 6, Source location: Online Market 360, http://www.onlinemarket.com/. Available: http://market360online.com/sqlimages/1182/42820.pdf, Accessed: Jan. 4, 2015.

"UMC Takes Delivery of 250th VECTOR PECVD System from Novellus." Sep. 1, 2004, pp. 1-2. Source location: Lam Research Corporation. http://www.lamrsearch.com/, Available: http://files.shareholder.com/downloads/LRCX/0x0x761840/E64871C7-4EA2-4456-9875-57206CCB600F/LRCX_News_2004_9_1_Novellus_Archive.pdf. Accessed: Jan. 4, 2015.

Sooyun Joh. "Modeling of a Cleaning Process in a PECVD Tool." Fluent 2005 Summit (Electronic & Fuel Cells Sessions). Source location: Lam Research Corporation. http://www.lamresearch.com/. Available: http://files.shareholder.com/downloads/NVLS/0x0x177642/5EE6BD48-1CDF-417D-B3EA-3898D286C3E6/pecvd.pdf. Accessed: Jan. 4, 2015.

Wikipedia.org, "Klein bottle," in Wikipedia.org. pp. 1-8. Source location: Wikipedia http://en.wikipedia.org/wiki/Klein_bottle. Available: http://en.wikipedia.org/wiki/Main_Page. Accessed: Jan. 9, 2015.

* cited by examiner

METHOD FOR PROCESSING A SEMICONDUCTOR WAFER USING A THIN EDGE CARRIER RING

CROSS REFERENCE TO RELATED APPLICATIONS

Under 35 U.S.C. § 120, this continuation application claims priority to and benefits of U.S. patent application Ser. No. 13/153,939 (TI-68426), entitled ("THIN EDGE CARRIER RING"), filed on Jun. 6, 2011, which claims priority to and benefits of U.S. Provisional Application No. 61/351,378, filed on Jun. 4, 2010. The entirety of both applications is incorporated herein by reference.

FIELD

This disclosure relates to the field of integrated circuit processing. More particularly, this disclosure relates thin film PECVD deposition.

BACKGROUND

During the manufacturing of an integrated circuit a number of dielectric films may be deposited. One technique used to deposit dielectric films at temperatures less than approximately 550 C is PECVD (plasma-enhanced chemical vapor deposition). Some PECVD tools are single wafer tools which a deposit dielectric thin film onto one wafer at a time. One important deposition criteria for the dielectric thin film is thickness uniformity across the wafer including the edges of the wafer. In order to provide uniform thickness out to and including the edges of a wafer the deposition may extend beyond the wafer edge. In PECVD deposition processes using pressures greater than about 12 Torr, a ring of deposited dielectric (also called a deposition fence) may form just outside the edge of the wafer on the pedestal or the wafer carrier ring upon which the wafer is positioned. The deposition fence typically presents a particle problem when the thickness builds up after dielectric deposition upon multiple wafers. The deposition fence may peel due to accumulated film stress or the deposition fence may become sufficiently thick to come into contact with the robot slider which transfers wafers into and out of the chamber. When the robot slider comes into contact with the deposition fence, pieces of the deposition fence may break off and redeposit on the wafer resulting in depressed yield.

Several methods have been developed to deal with the deposition fence. One method is to open the chamber and remove the deposition fence after a specified number of wafers have been processed. Another method is to periodically run a plasma clean step such as a NF3 plasma step to etch away the dielectric fence. Both solutions reduce the time that the deposition tool is available for manufacturing thus increasing manufacturing cost.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A PECVD deposition chamber with a circular pedestal with a recessed portion in the outer top surface of the pedestal. A PECVD deposition chamber with a circular wafer carrier ring with a recessed portion in the outer top surface of the wafer carrier ring.

DETAILED DESCRIPTION

Figure 1:
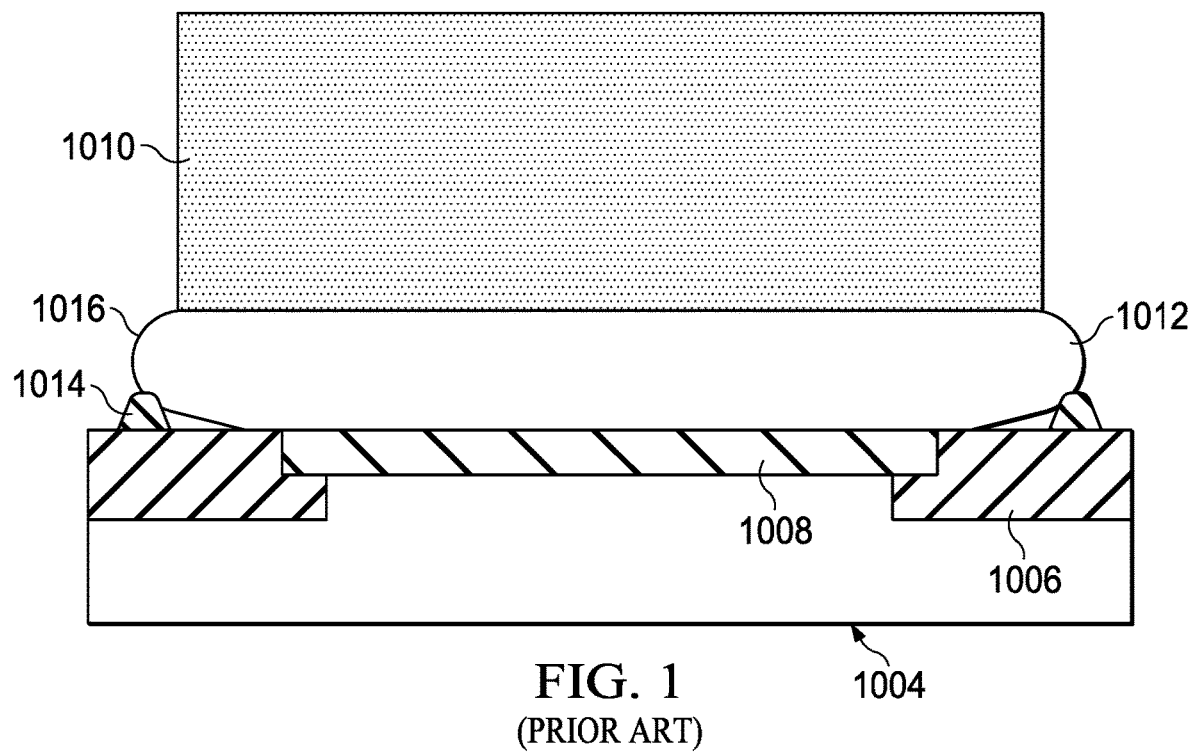
FIG. 1 is a cross-section of a PECVD deposition chamber illustrating the deposition plasma.

The present disclosure is described with reference to the attached figures, wherein like reference numerals are used throughout the figures to designate similar or equivalent elements. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Single wafer PECVD dielectric deposition tools come in a variety of designs. A dielectric tool may have a single chamber which processes a single wafer at a time or may have multiple chambers. A dielectric tool may also have a single chamber with multiple deposition stations for processing multiple wafers at a time. Multiple deposition stations may provide a more uniform film thickness by averaging out deposition nonuniformity that may occur in one of the deposition stations. In a multi-station deposition tool the wafer typically is placed on a carrier ring which transports the wafer from station to station.

The inside of a typical multi-station, single wafer deposition chamber is shown in FIG. 1. Wafer 1008 sits atop pedestal 1004. Carrier ring, 1006, which is used to transport the wafer from one deposition station to the next, surrounds the wafer 1008 providing an extended surface beyond the edge of the wafer. This extended surface facilitates uniform thin film deposition out to and including the edge of the wafer 1008. Reactants are dispensed from top electrode and showerhead, 1010, into the plasma 1012 and recombine at the plasma 1012/wafer 1008 interface to deposit dielectric on the wafer 1008 and recombine along the plasma edge 1016/chamber ambient interface to form a dielectric deposition fence 1014 on the wafer carrier ring 1006. The dielectric deposition fence 1014 may increase in thickness as additional wafers are processed.

Figure 2:
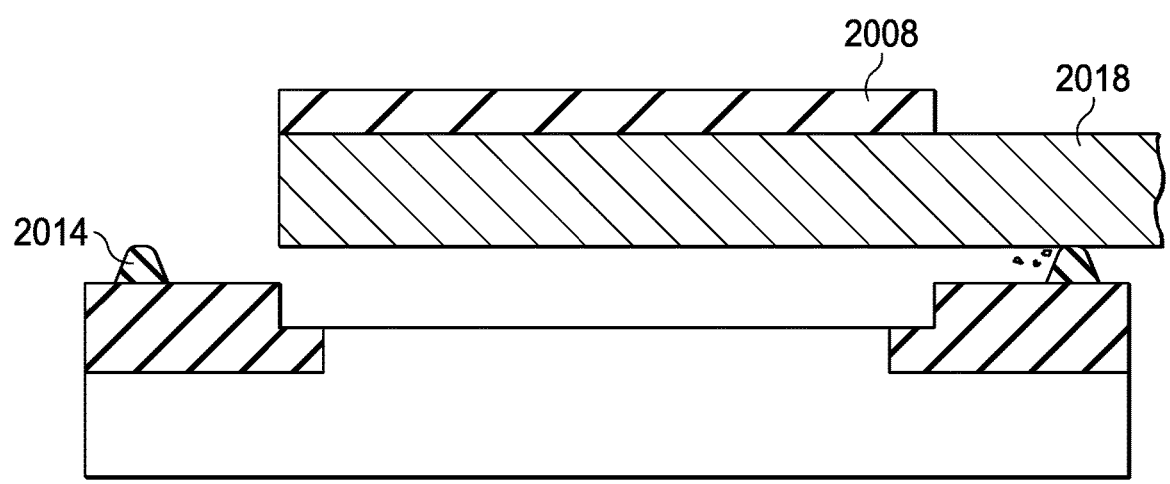
FIG. 2. is a cross-section of a PECVD deposition chamber illustrating a deposition fence.

As is illustrated in FIG. 2, the deposition fence 2014 may build up to a thickness where the robot slider 2018 which transports wafers into and out of the chamber, comes into contact with the deposition fence causing pieces of the deposition fence, 2014, to be broken off resulting in particles that may redeposit on wafer 2008 and depress yield.

Figure 3:
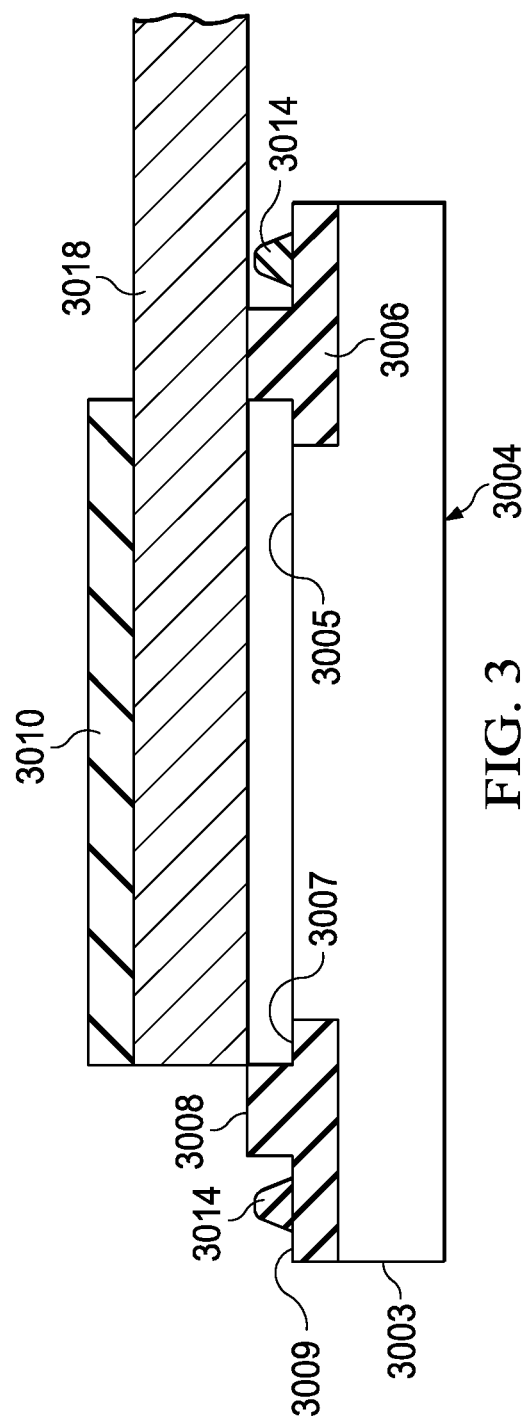
FIG. 3 is a cross-section of a PECVD deposition chamber with a wafer carrier ring formed according to embodiments.

An embodiment is illustrated in FIG. 3 which addresses the deposition fence problem. Pedestal 3004 has a central region 3005 surrounded by an outer region 3003, which is recessed with respect to central region 3005. Carrier ring 3006 surrounds central region 3005 and sits over outer region 3003 of pedestal 3004. Carrier ring 3006 includes a central region 3007, which surrounds and has an upper surface that is substantially coplanar with the upper surface of central region 3005 of pedestal 3004, a second region 3008, which surrounds central region 3007 and has an upper surface that is substantially coplanar with the upper surface of wafer 3010 when wafer 3010 is positioned on regions 3005 and 3007, and a third or outer region 3009, which surrounds and is recessed with respect to region 3008. Reactants dispensed from the top electrode and showerhead in a deposition chamber recombine along the interface between the plasma edge and chamber ambient to form dielectric deposition fence 3014 on outer region 3009 of carrier ring 3006. Outer region 3009 of the carrier ring 3006 where the deposition fence 3014 forms is recessed with respect to region 3008 so that the distance from the top of the deposition fence 3014 to the robot slider 3018 is increased. This increased distance, permits more wafers to be processed between plasma chamber cleans or openings thus increasing the time to process product wafers and reducing manufacturing cost.

Figure 4A:
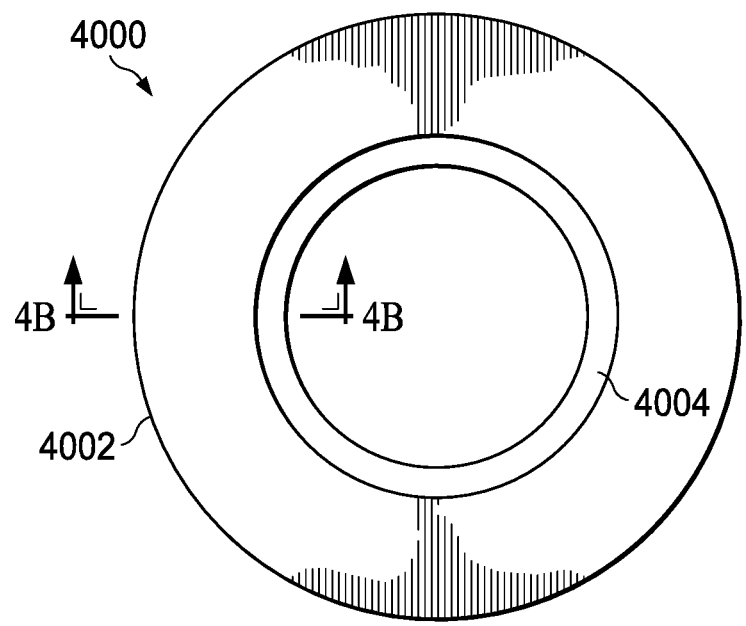
FIGS. 4A and 4B are a top down view and cross-sectional illustrations of a wafer carrier ring.
Figure 4B:
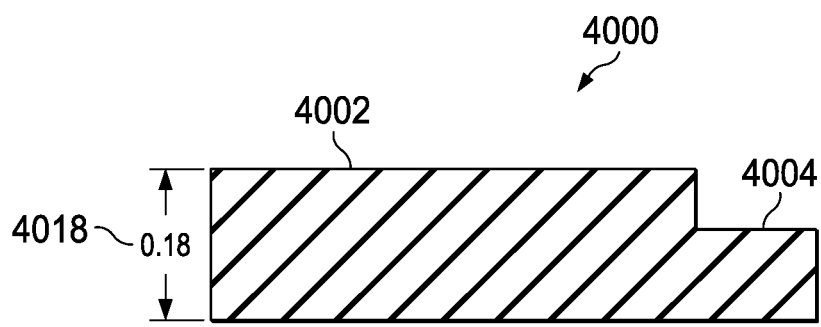

Top down and side views of a typical carrier ring 4000 are shown in FIGS. 4A and 4B. As shown in FIG. 4B the typical carrier ring 4000 has a center recess region 4004 in which the wafer rests, which is surrounded by region 4002. Region 4002 is of a uniform thickness 4018 out to the edge of the carrier ring. Thickness 4018 of region 4002 exceeds the thickness of center recess region 4004 by the thickness of wafers to be transported by carrier ring 4000.

Figure 5A:
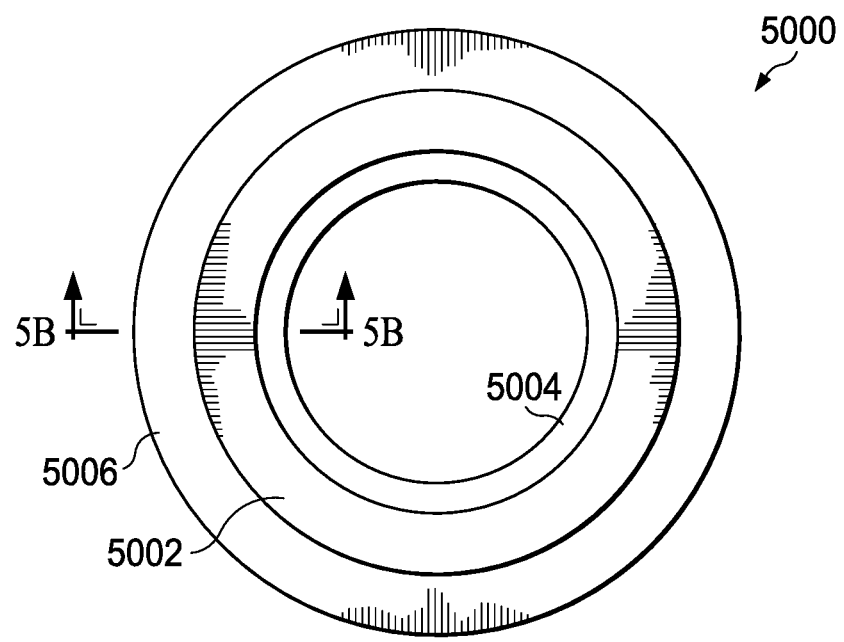
FIGS. 5A and 5B are a top down view and a cross-sectional illustration of a wafer carrier ring formed according to embodiments.
Figure 5B:
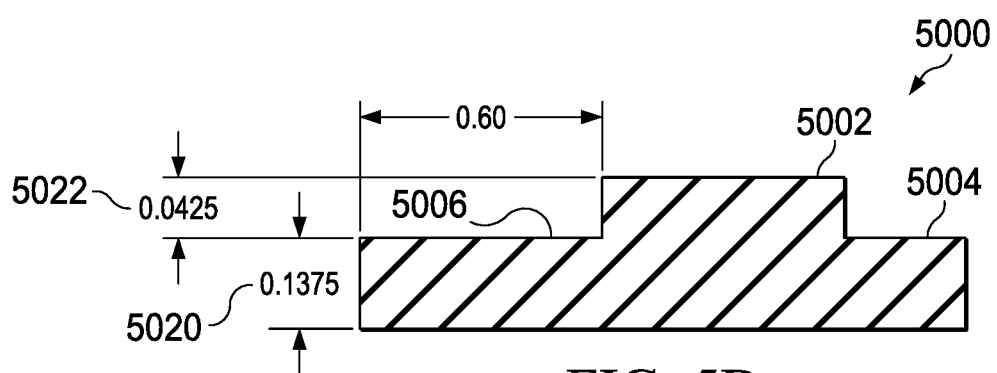

A top down and side view of a carrier ring 5000 according to an embodiment which addresses the deposition fence problem are shown in FIGS. 5A and 5B. As shown in FIG. 5B, carrier ring 5000 has a center recess region 5004 in which the wafer rests. Center recess region 5004 is surrounded by region 5002, which has a thickness that exceeds the thickness of center recess region 5004 by the thickness of wafers to be transported by carrier ring 5000. Carrier ring 5000 also has an outer portion 5006 where a deposition fence may form. Outer portion 5006 is recessed with respect to region 5002 to provide an increased distance between a deposition fence that forms in this area and a robot slider arm that transports a wafer into and out of the deposition chamber or transports the carrier ring plus the wafer from one deposition station to the next.

In an example embodiment, the multi-station deposition chamber is a Novellus Vector deposition chamber for the deposition of organo-silicate glass (OSG). As shown in FIG. 5B an outer portion of the wafer carrier ring 5006 is recessed. The ring recess 5006 may be in the range of 0.5 to 0.8 inches wide and 0.03 to 0.06 inches deep. In a preferred embodiment the ring recess is about 0.6+/−0.005 inches wide and about 0.0425+/+0.005 inches deep. Using the preferred embodiment, the ratio of the number of wafers able to be processed using a wafer carrier ring with the preferred embodiment recess to the number of wafers able to be processed without a recess prior to a chamber clean is approximately 1.6. This 60% increase in the number of wafers processed between chamber cleans may significantly reduce manufacturing cost.

Although the example embodiment used for illustration is a Novellus Vector, other Novellus PECVD deposition equipment may also benefit. In addition, other multi-station deposition tools and other single wafer, single station deposition tools may benefit. Although the example embodiment used for illustration is an OSG dielectric deposition, other films that are deposited with a pressure greater than about 12 Torr and may form deposition fences may also benefit.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method, comprising:
   placing a carrier ring inside a deposition chamber, the carrier ring including a central region, a second region surrounding the central region, and an outer region surrounding the second region, the outer region having an upper surface that is recessed from an upper surface of the second region;
   placing a semiconductor wafer into a receptacle defined by the central region and the second region of the carrier ring, the upper surface of the second region being substantially coplanar with an upper surface of the semiconductor wafer;
   releasing a dielectric material in the deposition chamber; and
   retaining a fence of the dielectric material with the outer region of the carrier ring.

2. The method of claim 1, wherein the placing the carrier ring inside the deposition chamber includes placing the carrier ring inside a plasma-enhanced chemical vapor deposition (PECVD) chamber.

3. The method of claim 1, wherein the dielectric material includes an organo-silicate material.

4. The method of claim 1, wherein the retaining the portion of the dielectric material includes retaining the portion of the dielectric material until the retained dielectric material levels with the top surface of the second region.

5. The method of claim 1, further comprising:
   removing the retained dielectric material from the carrier ring only when the retained dielectric material levels with the top surface of the second region.

6. The method of claim 1, further comprising:
   cleaning the deposition chamber after the retained dielectric material levels with the top surface of the second region.

7. The method of claim 1, further comprising:
   retrieving the semiconductor wafer after the dielectric material is released without contacting the retained dielectric material.

8. The method of claim 7, wherein the retrieving the semiconductor wafer includes retrieving the semiconductor wafer using a robot slider while avoid contacting the retained dielectric material by the robot slider.

9. The method of claim 7, further comprising:
placing a second semiconductor wafer into the receptacle after the semiconductor wafer is retrieved and without contacting the retained dielectric material.

10. The method of claim 1, further comprising:
cleaning the deposition chamber after the retained material levels with a top surface of the carrier ring.

11. The method of claim 1, wherein the deposition chamber has a pressure greater than or equal to 12 Torr.

12. A method, comprising:
placing a carrier ring inside a deposition chamber, the carrier ring including a receptacle within which a semiconductor wafer rests, the receptacle having an upper surface that is substantially coplanar with an upper surface of the semiconductor wafer, the carrier ring also including a recess region positioned outside of the receptacle;
releasing a dielectric material for deposition onto a number of the semiconductor wafers chronologically and individually placed within the receptacle of the carrier ring; and
retaining a fence of the dielectric material with the outer region of the carrier ring.

13. The method of claim 12, wherein the placing the carrier ring inside the deposition chamber includes placing the carrier ring inside a plasma-enhanced chemical vapor deposition (PECVD) chamber.

14. The method of claim 12, wherein the dielectric material includes an organo-silicate material.

15. The method of claim 12, wherein the number of semiconductor wafers is proportional to a depth of the recess region.

16. The method of claim 12, further comprising:
refraining from cleaning the deposition chamber in between the depositions of the semiconductor wafers until the retained dielectric material levels with a top surface of the carrier ring.

17. The method of claim 12, further comprising:
removing the deposited semiconductor wafers from the deposition chamber without contacting the retained dielectric material.

18. The method of claim 17, wherein the removing the deposited semiconductor wafers includes removing the deposited semiconductor wafer using a robot slider while avoid contacting the retained dielectric material by the robot slider.

19. The method of claim 12, further comprising:
placing the semiconductor wafers into the deposition chamber without contacting the retained dielectric material.

20. The method of claim 19, wherein the placing the semiconductor wafers includes placing the semiconductor wafers into the deposition chamber using a robot slider while avoid contacting the retained dielectric material by the robot slider.

21. The method of claim 12, further comprising:
removing the retained deposition material from the carrier ring only when the retained dielectric material levels with a top surface of the carrier ring.

22. The method of claim 12, wherein the deposition chamber has a pressure greater than or equal to 12 Torr.

* * * * *